(12) United States Patent
Swart

(10) Patent No.: US 6,191,600 B1
(45) Date of Patent: Feb. 20, 2001

(54) SCAN TEST APPARATUS FOR CONTINUITY TESTING OF BARE PRINTED CIRCUIT BOARDS

(75) Inventor: Mark A. Swart, Anaheim Hills, CA (US)

(73) Assignee: Delaware Capital Formation, Inc., Wilmington, DE (US)

(*) Notice: Under 35 U.S.C. 154(b), the term of this patent shall be extended for 0 days.

(21) Appl. No.: 09/236,029

(22) Filed: Jan. 22, 1999

(51) Int. Cl.[7] .................................................. G01R 31/02
(52) U.S. Cl. ................................................ 324/761; 324/537
(58) Field of Search ................................ 324/754, 761, 324/762, 500, 537, 538, 765; 439/264, 912; 714/46, 32

(56) References Cited

U.S. PATENT DOCUMENTS 3,629,702 * 12/1971 Henken .................................. 324/761
4,836,797 *  6/1989 Riechelmann ......................... 439/264
5,506,510 *  4/1996 Blumenau ............................. 324/754

FOREIGN PATENT DOCUMENTS

19730516A1   1/1999 (DE).
   773445     5/1997 (EP).
  2267970   12/1993 (GB).

OTHER PUBLICATIONS

DeGroat et al., "Finding Shorts in Printed Circuit Boards", IBM Technical Disclosure Bulletin, vol. 12, No. 5, Oct. 1969, pp. 655–656.

* cited by examiner

Primary Examiner—Vinh P. Nguyen
(74) Attorney, Agent, or Firm—Christie, Parker & Hale, LLP

(57) ABSTRACT

A scan test apparatus for continuity testing of bare printed circuit boards having a first shorting layer and a second shorting layer positioned adjacent a unit under test to electrically short the circuit on the unit under test. At least one of the first or second shorting layers includes a row of wipers for generating test signals as the wiper contacts test sites on the unit under test as the unit under test is moved across the wiper. Measurement electronics are electrically connected to the wiper for receipt of the test signals for comparison to stored data and elimination from further testing if the test signals and stored data match.

20 Claims, 3 Drawing Sheets

SCAN TEST APPARATUS FOR CONTINUITY TESTING OF BARE PRINTED CIRCUIT BOARDS

FIELD OF THE INVENTION

This invention relates to the automatic testing of printed circuit boards, and more particularly, to a scan test apparatus which scans test sites on a bare printed circuit board to discern continuities and eliminates test sites from testing when confirmed correct.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high-speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wire test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so-called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

Translator fixtures can be constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Several problems are associated with these types of test fixtures when the test points on the printed circuit board are positioned very closely together and are very thin. Individual test points are commonly referred to as test pads, and a group of test pads are commonly known as a test pack. When the tilt pins contact very thin test pads, the pads can be crushed or bent by the tilt pins. Depending upon the degree of damage to the test pads, and how closely they are positioned, individual pads can be permanently shorted together during testing.

A second problem occurring with these types of test fixtures is the difficulty in achieving accurate test results for a test pack when the pads are very closely spaced. It becomes very difficult to direct a tilt pin to each pad within the pack when the pads are so closely spaced. Slight misalignments of test pins can affect the test results, reducing test accuracy.

A third problem is encountered for packs having a grid density of pads which is greater than the grid density of the test probes, such as when the test pack is formed as a ball grid array (BGA) or a quad flat pack (QFP). In such instances there are not enough translation pins available for testing each test pad and thorough testing of the pack is not possible.

To address these problems a printed circuit board test fixture capable of accurately and safely testing circuit boards having small scale test packs was developed which included a pneumatically actuated shorting plate positioned in the fixture corresponding to the location on the printed circuit board where a group of very closely spaced test points were to be tested. A hole was cut through the upper translator plates corresponding to the dimension of the shorting plate to allow the shorting plate to engage the unit under test. A layer of compliant conductive media was positioned over the upper surface of the shorting plate for electrical connection to the test points. The shorting plate included a snap fitting for attachment to an air cylinder extending downwardly through the layers of translator plates. The air cylinder was attached at the bottom of the fixture by a base plug which snaps into a base receptacle rigidly secured to a lower translator plate of the fixture.

During testing of the unit under test, the air cylinder was energized, raising the shorting plate into contact with the test pack, effectively shorting them together for testing without bending or damaging the test points.

A problem with this method is that since all the test sites are shorted together during testing it can not be determined whether one or more individual test sites within the pack are incorrectly shorted together.

An alternative method for testing densely spaced test packs is with a flying prober to touch each individual pad within the pack. A prober typically performs two types of tests which are isolation testing and continuities testing. In isolation testing the prober will contact one point within two networks. In continuity testing each test pad must be contacted. This method of continuity testing is undesirable due to the extremely time consuming process of contacting each test pad.

Consequently a need exists for improved test equipment for continuity testing of bare printed circuit boards which quickly produces test results.

SUMMARY OF THE INVENTION

The present invention comprises a scan test machine for continuity testing of bare printed circuit boards. Previously in continuity testing of printed circuit boards, the tester physically contacted 100% of the test sites on the circuit board checking for potential problems with the circuit board. The scan test machine of the present invention, on the contrary, does not test the board to determine problems but rather quickly scans the board to find proper connections and then eliminates those test sites from the test routine. The present invention is able to quickly eliminate 80 to 90% of all test sites wherein the remaining test sites can be tested by conventional methods such as by a prober. The scan test machine of the present invention comprises an upper layer of conductive and compliant material and a lower layer of conductive and compliant material sized to be able to cover the entire upper and lower surface of the printed circuit board to be tested. Electrical current is introduced into the conductive layers which shorts out the circuits on the printed circuit board. A row of wiper brushes extends through either or both of the upper and lower conductive layers. Each individual wiper brush is wired to discrete switches on a circuit board which is cabled to measurement electronics.

The unit under test is passed through the upper and lower conductive layers and the wiper brushes turn on as they pass over a test point. When the wiper brush is turned on, it sends a test signal through to the measurement electronics. The measurement electronics includes software having stored test data for the particular unit under test. The stored test data is compared to the test data from the wiper brush and if they match, those test locations are eliminated from further testing.

These and other aspects of the invention will be more fully understood by referring to the following detailed description and the accompanying drawings.

DETAILED DESCRIPTION

Figure 1:
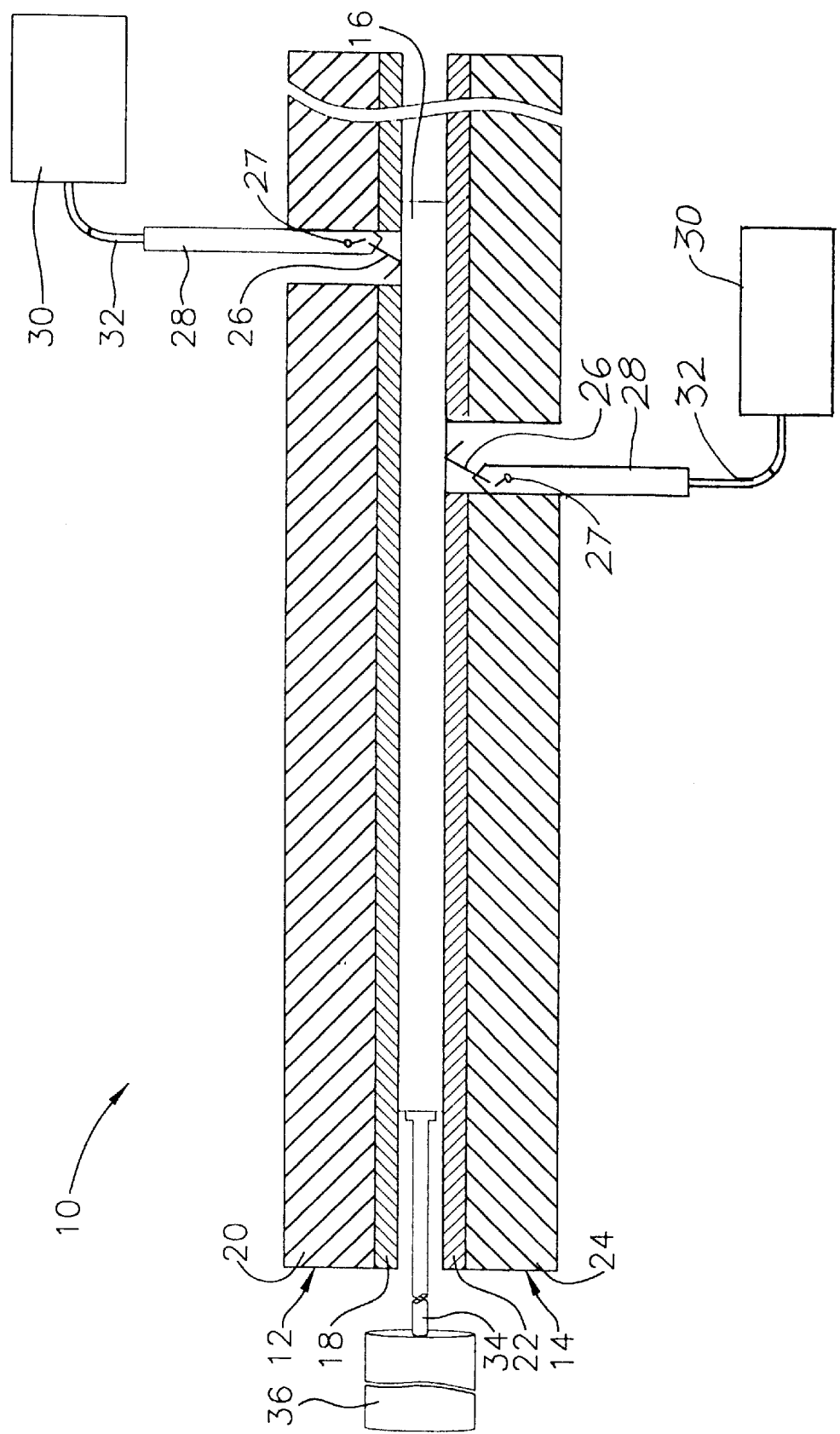
FIG. 1 is a side schematic view of the scan test apparatus of the present invention.

One embodiment of the scan test apparatus 10 of the present invention is shown in FIG. 1. The scan test apparatus includes an upper shorting layer 12 and a lower shorting layer 14 which during testing sandwiches the printed circuit board to be tested or unit under test 16. The upper shorting layer comprises an inner conductive layer 18 such as conductive cloth or metal and an outer compliant layer 20 such as foam. Similarly, the lower shorting layer has an inner conductive layer 22 and an outer compliant layer 24 made of the same materials as the upper shorting layer. Alternatively, the upper shorting layer 12 and the lower shorting layer 14 can consist of a single material which is both conductive and compliant such as conductive rubber.

Extending across either or both of the upper shorting layer and the lower shorting layer is a row of wiper brushes 26. Each wiper brush is wired to discrete switches 27 in a printed circuit board 28. The printed circuit board 28 is connected to measurement electronics 30 by a cable 32.

The upper and lower shorting layers must contact the entire unit under test except for the row of wiper brushes which is wider than the width of the unit under test. If a row of wiper brushes is located in both the upper and lower shorting layers, they must be offset from one another so as not to contact the unit under test at the same location along the length of the board. The unit under test 16 is sandwiched between the upper and lower shorting layers which shorts out both sides of the unit under test by an electrical current introduced into the conductive layers of the shorting layers. With a shorting current introduced into the unit under test, it is pushed underneath the wiper brushes 26 by a push rod 34. Push rod 34 is actuated by a pneumatic cylinder, a hydraulic cylinder or a linear motor 36.

Figure 2:
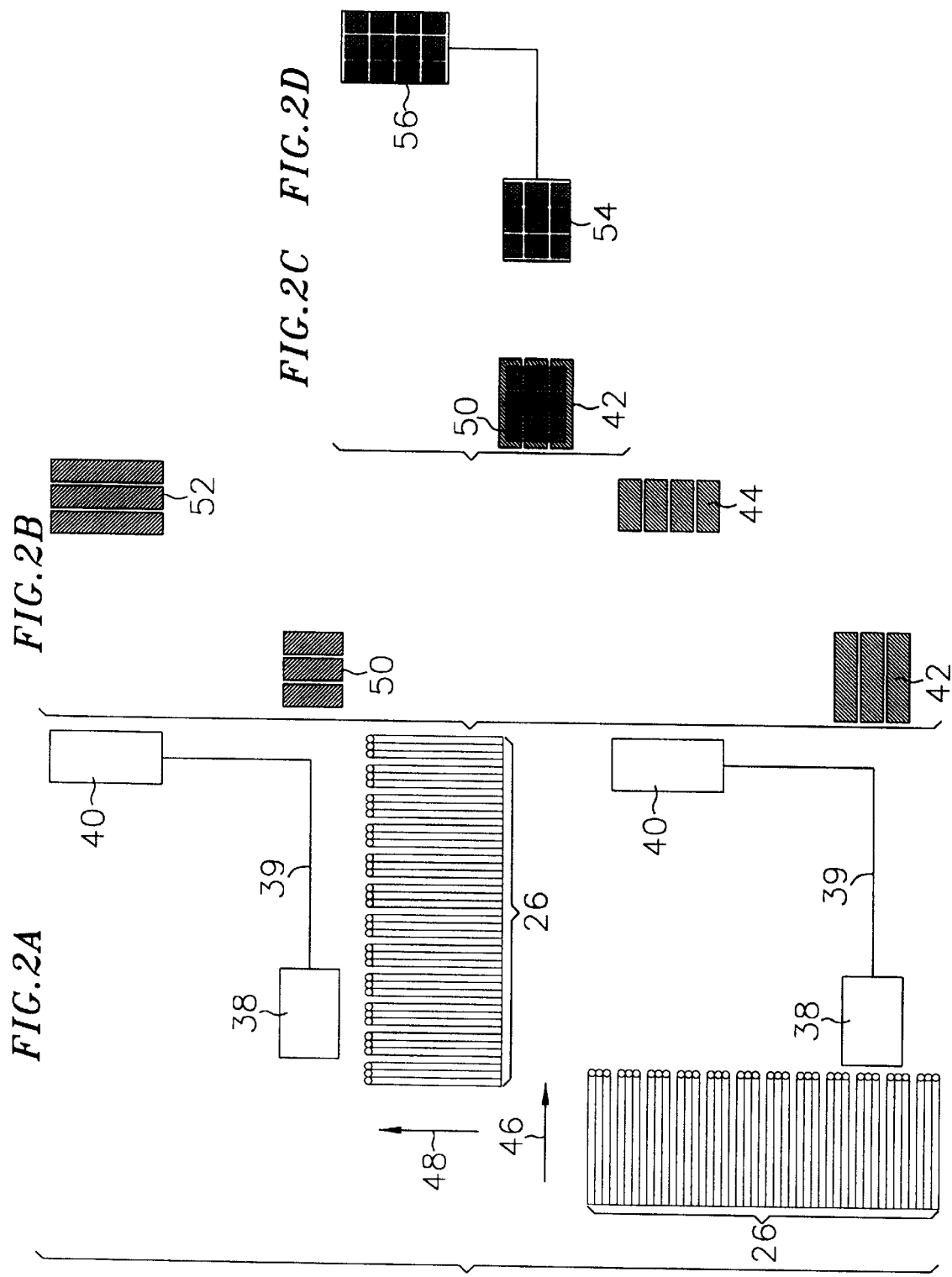
FIGS. 2a–2d are schematic detail views of the wiper brush and test signals generated by the scan test apparatus of FIG. 1.

The unit under test 16 includes numerous test pads connected by traces, such as for example test pads 38 and 40 connected by trace 39, as shown in FIG. 2a. As shown in FIGS. 2a through 2d, as the unit under test 16 passes beneath the wiper brushes 26 individual test pads 38 and 40, if properly connected and carrying a current, will turn on the individual wiper brushes contacting the test pads. The turned on wiper brushes will send a signal to the measurement electronics which will generate a first test image 42 and 44 for test pads 38 and 40 by software programmed into the measurement electronics. Individual test pads on the unit under test will vary in size and may not coincide with the exact width of adjacent wiper brushes. Consequently, the first test images 42 and 44 generated will coincide with the width of the wiper brushes turned on by the test pads which may not be the exact physical dimension of the test pad itself. First test images 42 and 44 are generated when the unit under test is passed beneath the wiper brushes in direction 46. Since the first test image may be larger than the actual test pads, the unit under test is rotated 90° and passed beneath the wiper brushes a second time in direction 48. As the wiper brushes contact the test pads 38 and 40 for the second time, they will generate a second test image 50 and 52 corresponding to a second dimension of the test pads. The software for the measurement electronics then superimposes the second test image upon the first test image as shown in FIG. 2c which results in a final test image 54 and 56 which is the area of overlap between the first and second test images corresponding to test pads 38 and 40. The final test image is then compared to net list data or test pad data contained within the software. The software compares the stored data with the scanned data and if they match, the software eliminates those test pads from subsequent continuity testing to be done by conventional means such as by a prober.

If, for example, trace 39 was broken and did not properly electrically connect test pads 38 and 40, the wiper brushes would not have been able to generate the necessary final test image and the software would identify test pads 38 and 40 as potential problem areas needing further continuity testing by a prober.

The present invention eliminates test points from further continuity testing by electrically scanning the circuit board and looking for what is properly electrically connected in the circuit. By eliminating what is properly electrically connected, 80 to 90% of all test pads can be eliminated from testing by conventional methods. The scan test apparatus of the present invention significantly reduces the time necessary to perform continuity testing on bare printed circuit boards.

Figure 3:
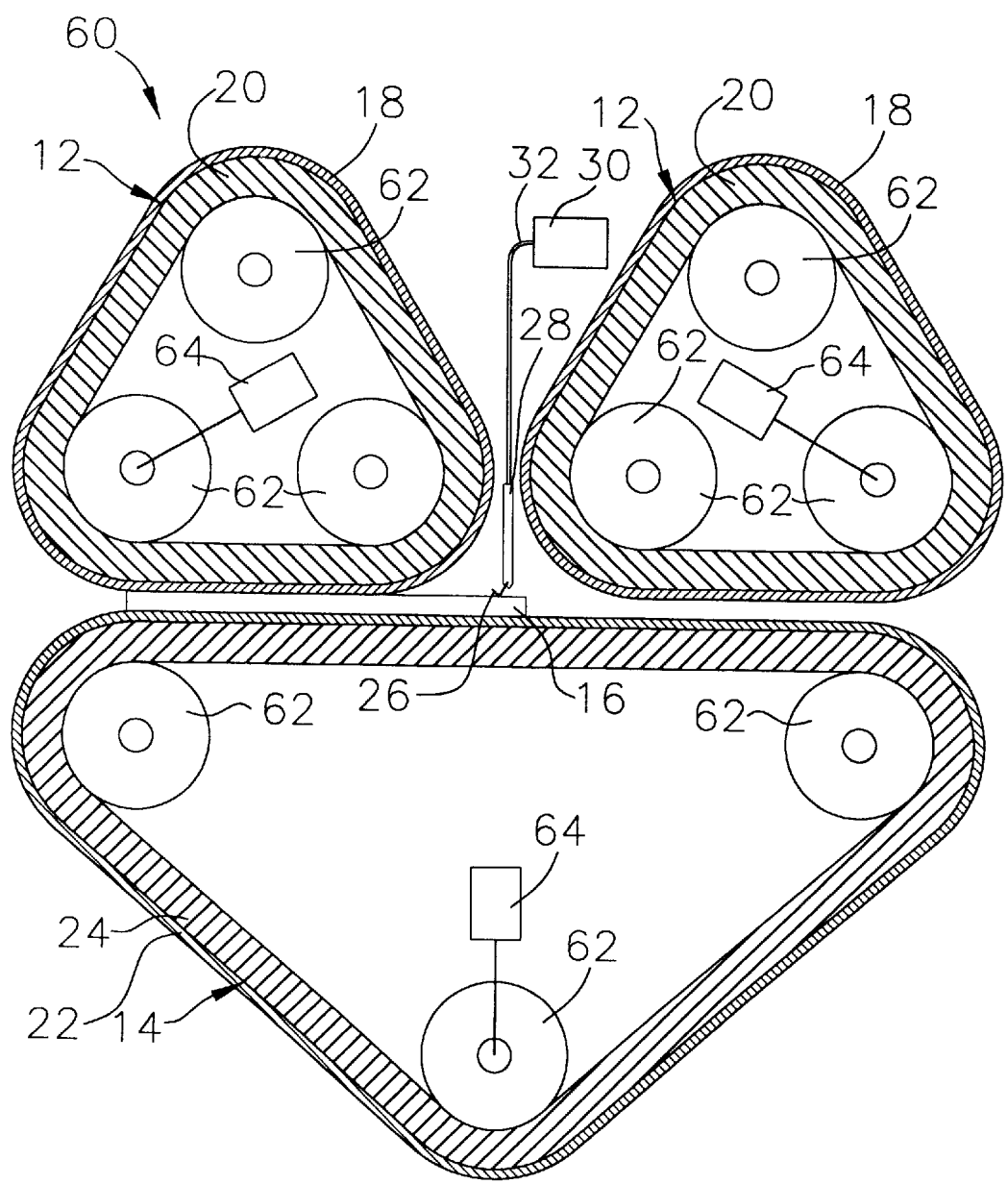
FIG. 3 is a side schematic view of a first alternative embodiment scan test apparatus.

FIG. 3 illustrates an alternative embodiment scan testing apparatus 60 of the present invention. In the scan testing apparatus, the upper and lower shorting layers 12 and 14 are formed in a continuous loop around rollers 62 which are driven by a motor 64. In this embodiment, the unit under test 16 is driven past the wiper brushes by the upper and lower shorting layers to generate the test images.

The present invention has been described and is illustrated with respect to embodiments thereof, it is to be understood that it is not to be so limited, since changes and modifications may be made therein which are within the full intended scope of this invention as hereinafter claimed.

What is claimed is:

1. A scan test apparatus for continuity testing of bare printed circuit boards comprising:
   a first shorting layer and a second shorting layer arranged to electrically short a unit under test;
   a wiper extending across a width of at least one of the first or second shorting layers for generating test signals as the wiper contacts test sites on the unit under test;
   means for moving the unit under test past the wiper; and
   measurement electronics electrically connected to the wiper for receipt of the test signals for comparison to stored data and elimination from further testing.

2. The scan test apparatus of claim 1 wherein the first and second shorting layers comprise a conductive layer adjacent the unit under test and a separate compliant layer adjacent the conductive layer opposite the unit under test.

3. The scan test apparatus of claim 2 wherein the conductive layer is conductive cloth and the compliant layer is foam.

4. The scan test apparatus of claim 1 wherein the first and second shorting layers are a single conductive and compliant layer.

5. The scan test apparatus of claim 4 wherein the conductive and compliant layer is conductive rubber.

6. The scan test apparatus of claim 1 wherein a wiper extends across both the first and second shorting layers offset from one another on opposite sides of the unit under test.

7. The scan test apparatus of claim 1 wherein the wiper is a row of brushes.

8. The scan test apparatus of claim 7 wherein the brushes are electrically connected to a printed circuit board by switches.

9. The scan test apparatus of claim 1 wherein the moving means is a push rod.

10. The scan test apparatus of claim 1 wherein the moving means is the first and second shorting layers formed in a continuous loop around a plurality of rotating rollers.

11. The scan test apparatus for continuity testing of bare printed circuit boards comprising:
    means for introducing an electrical shorting current into a unit under test;
    means for generating test signals by wiping test sites on the unit under test across an entire width of the unit under test;
    means for moving the unit under test into contact with the means for generating test signals; and
    means for comparing the test signals with stored test data and eliminating the test sites from further testing if the test signals match the stored test data.

12. The scan test apparatus of claim 11 wherein the means for introducing an electrical shorting current into the unit under test is a first shorting laver and a second shorting layer each positioned on an opposite side of the unit under test.

13. The scan test apparatus of claim 12 wherein the first shorting layer and the second shorting layer comprise a conductive layer and a compliant layer.

14. The scan test apparatus of claim 13 wherein the means for generating a test signal comprises a wiper extending across a width of at least one of the first shorting layer or the second shorting layer.

15. The scan test apparatus of claim 14 wherein the wiper is a row of brushes.

16. The scan test apparatus of claim 14 wherein a wiper extends across both the first shorting layer and the second shorting layer offset from one another on opposite sides of the unit under test.

17. The scan test apparatus of claim 15 wherein the brushes are electrically connected to a printed circuit board by switches.

18. The scan test apparatus of claim 12 wherein the means for moving the unit under test into contact with the means for generating test signals is the first shorting layer and the second shorting layer formed in a continuous loop around a plurality of rotatable rollers.

19. The scan test apparatus of claim 11 wherein the means for moving the unit under test into contact with the means for generating test signals is a push rod.

20. A method of continuity testing a printed circuit board comprising the steps of:
    shorting the printed circuit board;
    wiping test sites on the printed circuit board;
    generating test signals from the test sites;
    comparing the test signals to control data; and
    eliminating the test sites from further testing if the test signals match the control data.

* * * * *

UNITED STATES PATENT AND TRADEMARK OFFICE
CERTIFICATE OF CORRECTION

PATENT NO. : 6,191,600 B1
DATED : February 20, 2001
INVENTOR(S) : Mark A. Swart

It is certified that error appears in the above-identified patent and that said Letters Patent is hereby corrected as shown below:

<u>Column 6,</u>
Line 27, replace "laver" with -- layer --.

Signed and Sealed this

Twenty-eighth Day of May, 2002

*Attest:*

*Attesting Officer*

JAMES E. ROGAN
*Director of the United States Patent and Trademark Office*